(12) United States Patent
Avramescu et al.

(10) Patent No.: US 9,202,971 B2
(45) Date of Patent: Dec. 1, 2015

(54) OPTOELECTRONIC SEMICONDUCTOR CHIP

(71) Applicant: OSRAM OPTO SEMICONDUCTORS GMBH, Regensburg (DE)

(72) Inventors: Adrian Avramescu, Regensburg (DE); Désirée Queren, Neutraubling (DE); Christoph Eichler, Tegernheim (DE); Matthias Sabathil, Regensburg (DE); Stephan Lutgen, Dresden (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/535,044

(22) Filed: Nov. 6, 2014

(65) Prior Publication Data

US 2015/0063395 A1 Mar. 5, 2015

Related U.S. Application Data

(62) Division of application No. 13/262,583, filed as application No. PCT/EP2010/053047 on Mar. 10, 2010, now Pat. No. 8,908,733.

(30) Foreign Application Priority Data

Mar. 30, 2009 (DE) .......................... 10 2009 015 569

(51) Int. Cl.
*H01S 5/00* (2006.01)
*H01L 33/06* (2010.01)
(Continued)

(52) U.S. Cl.
CPC ................ *H01L 33/06* (2013.01); *B82Y 20/00* (2013.01); *H01L 33/32* (2013.01); *H01S 5/3407* (2013.01);
(Continued)

(58) Field of Classification Search
CPC ............................... H01S 5/3425; H01S 5/343
USPC ............................... 372/45.01; 257/14, 15, 22
See application file for complete search history.

(56) References Cited

U.S. PATENT DOCUMENTS 5,345,461 A * 9/1994 Ahn et al. .................. 372/45.01
6,849,881 B1 2/2005 Harle et al.
(Continued)

FOREIGN PATENT DOCUMENTS

DE 10 2007 044 439 3/2009
EP 1 667 292 6/2006
(Continued)

OTHER PUBLICATIONS

Davydov et al., "Band Gap of Hexagonal InN and InGaN Alloys", Physica Status Solidi (b); vol. 234, Issue 3; 2002; pp. 787-795.
(Continued)

*Primary Examiner* — Tod T Van Roy
(74) *Attorney, Agent, or Firm* — Cozen O'Connor

(57) ABSTRACT

An optoelectronic semiconductor chip, based on a nitride material system, comprising at least one active quantum well, wherein during operation electromagnetic radiation is generated in the active quantum well, the active quantum well comprises N successive zones in a direction parallel to a growth direction z of the semiconductor chip, N being a natural number greater than or equal to 2, the zones are numbered consecutively in a direction parallel to the growth direction z, at least two of the zones have average aluminium contents k which differ from one another, and the active quantum well fulfils the condition:

$50 \le \int (35-k(z))dz - 2.5N - 1.5 \int dz \le 120.$

10 Claims, 9 Drawing Sheets

(51) Int. Cl.
   *B82Y 20/00* (2011.01)
   *H01L 33/32* (2010.01)
   *H01S 5/34* (2006.01)
   *H01S 5/343* (2006.01)

(52) U.S. Cl.
   CPC ........... *H01S 5/3425* (2013.01); *H01S 5/34333* (2013.01); *H01L 2924/0002* (2013.01); *H01S 2301/173* (2013.01); *Y10S 977/95* (2013.01); *Y10S 977/951* (2013.01)

(56) References Cited

U.S. PATENT DOCUMENTS

| | | | |
|---|---|---|---|
| 8,779,412 B2* | 7/2014 | Han | .......... H01L 33/06 257/13 |
| 2003/0118066 A1* | 6/2003 | Bour et al. | .......... 372/45 |
| 2005/0116216 A1 | 6/2005 | Harle et al. | |
| 2005/0156153 A1 | 7/2005 | Futagawa | |
| 2005/0224781 A1 | 10/2005 | Kneissl et al. | |
| 2007/0075307 A1 | 4/2007 | Yoon et al. | |
| 2007/0241344 A1 | 10/2007 | Adachi et al. | |
| 2008/0217632 A1 | 9/2008 | Tomiya et al. | |
| 2008/0283822 A1 | 11/2008 | Yui | |
| 2008/0315179 A1 | 12/2008 | Kim et al. | |

FOREIGN PATENT DOCUMENTS

| | | |
|---|---|---|
| JP | 2002-368343 | 12/2002 |
| JP | 2003-273473 | 9/2003 |
| JP | 2004 356256 | 12/2004 |
| JP | 2005-012216 | 1/2005 |
| JP | 2007-067418 | 3/2007 |
| JP | 2007-515791 | 6/2007 |
| WO | WO 2005/020396 | 3/2005 |
| WO | WO 2007/023419 | 3/2007 |

OTHER PUBLICATIONS

Wu. et al., "Small Band Gap Bowing in $In_{1-x}Ga_xN$ Alloys", Applied Physics Letters; vol. 80, Nr. 25; 2002; pp. 4741-4743.

* cited by examiner

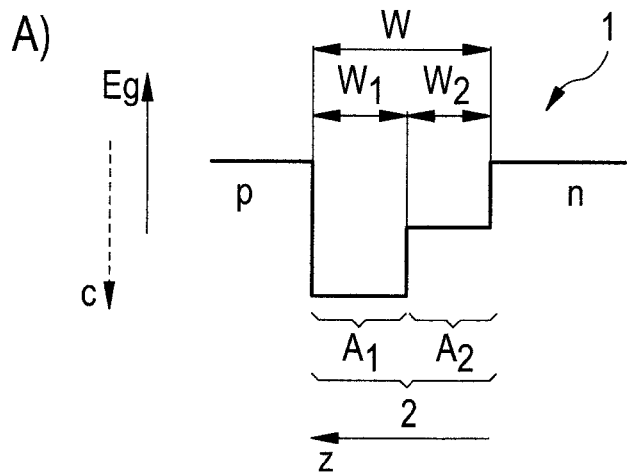
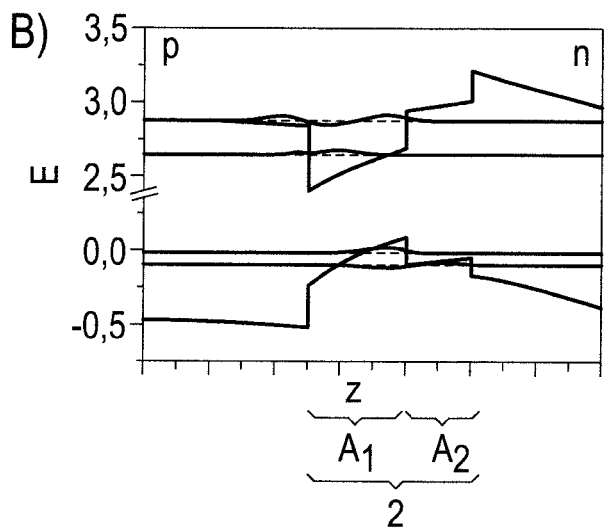
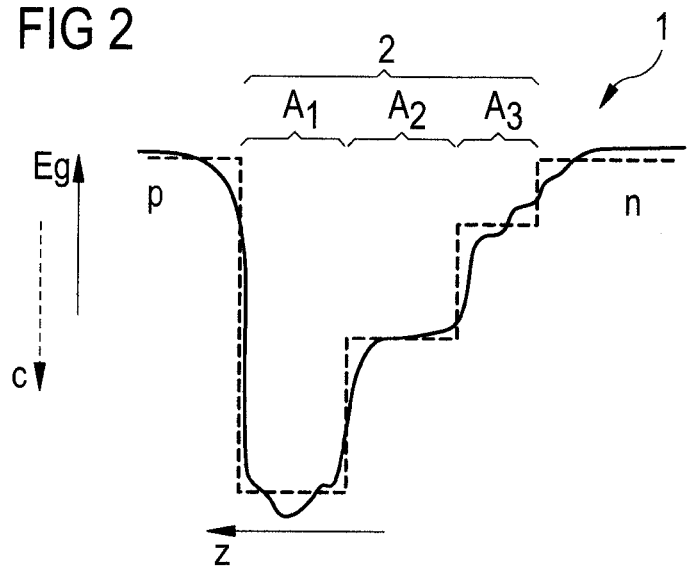

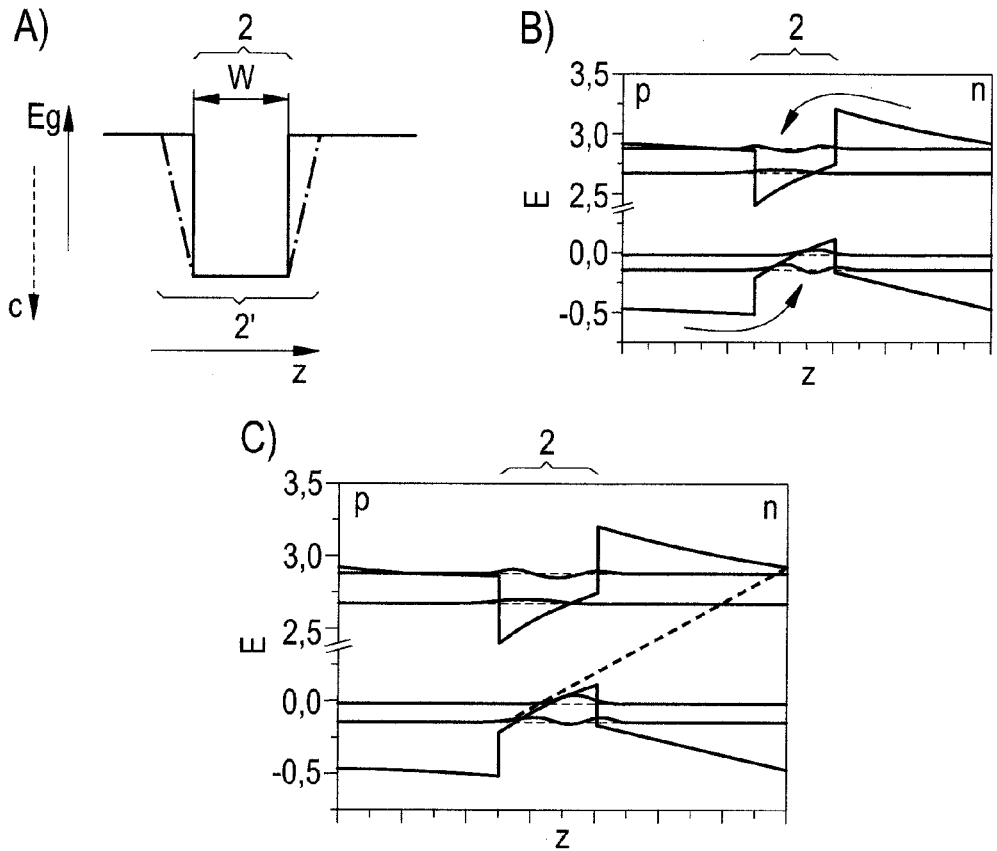
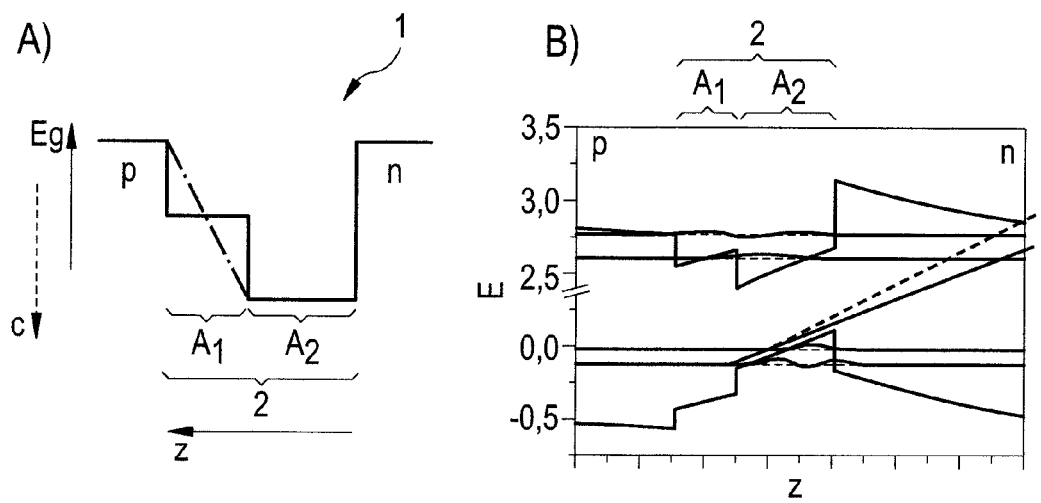

FIG 5
A)
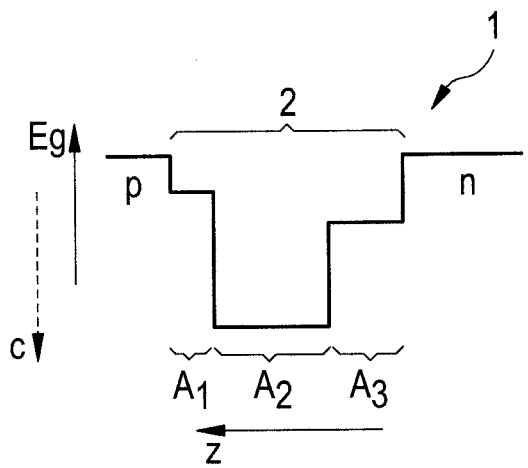
B)
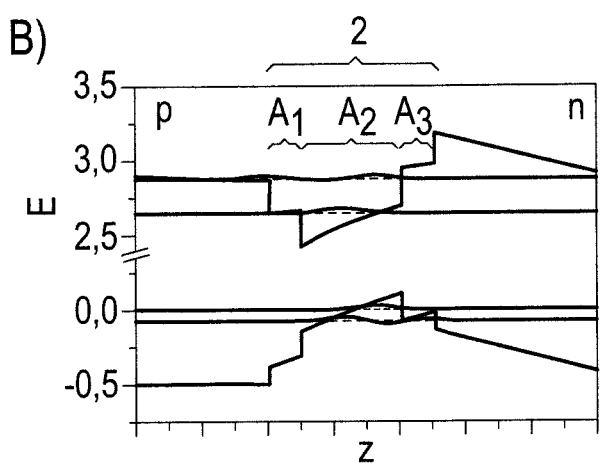
FIG 6
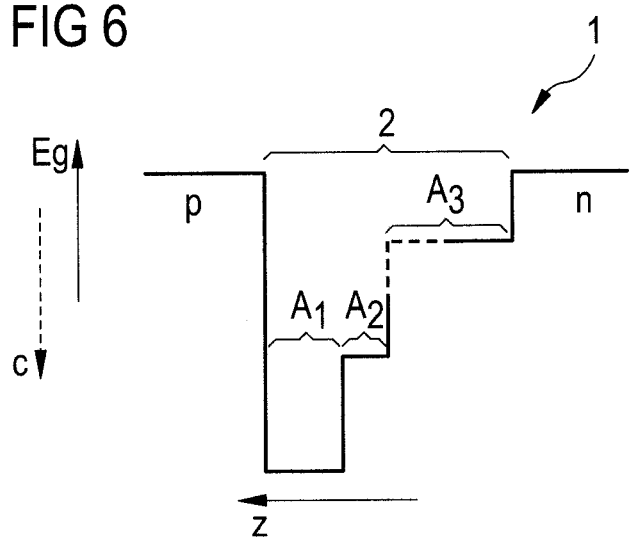

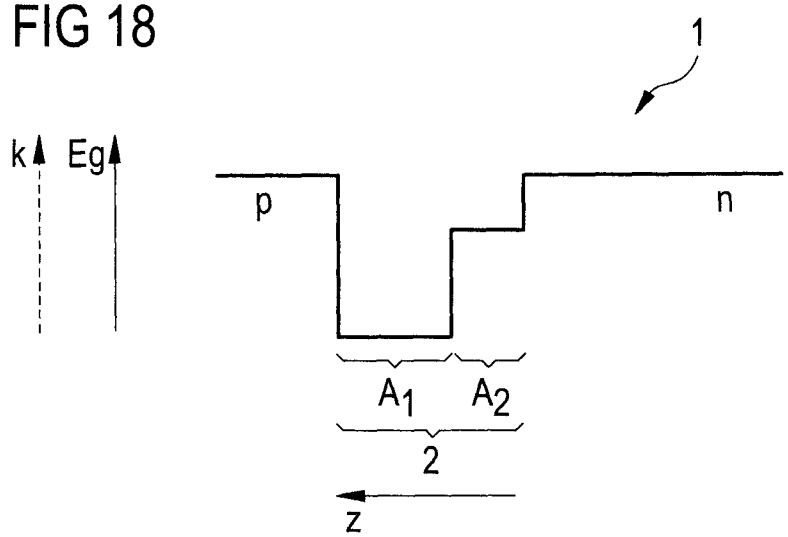

OPTOELECTRONIC SEMICONDUCTOR CHIP

CROSS REFERENCE TO RELATED APPLICATIONS

This application is a divisional of U.S. Ser. No. 13/262,583 filed Dec. 15, 2011 which claims priority under 35 U.S.C. 371 of International application No. PCT/EP2010/053047 filed on Mar. 10, 2010. Priority is also claimed of German application no. 10 2009 015 569.4 filed Mar. 30, 2009, the entire content of which is hereby incorporated by reference.

FIELD OF THE INVENTION

An optoelectronic semiconductor chip is provided.

BACKGROUND OF THE INVENTION

Document U.S. Pat. No. 6,849,881 B1 relates to an optoelectronic semiconductor component with a multi-quantum well structure.

SUMMARY OF THE INVENTION

An object of the invention is to provide an optoelectronic semiconductor chip with a quantum well structure which in operation generates radiation highly efficiently.

According to at least one embodiment of the optoelectronic semiconductor chip, the latter is based on a nitride material system. In other words, one component of the semiconductor material from which the semiconductor chip is made is nitrogen. The material system is thus for instance a III-nitride semiconductor material. For example the semiconductor chip is based on AlGaN, GaN, InGaN or InAlGaN.

According to at least one embodiment of the optoelectronic semiconductor chip, the latter is grown epitaxially. The epitaxial growth defines a growth direction z.

According to at least one embodiment of the optoelectronic semiconductor chip, the latter comprises at least one active quantum well. The term quantum well does not here have any meaning with regard to the dimensionality of the quantisation. The quantum well may thus be a zero-dimensional quantum dot, a one-dimensional quantum wire or a multidimensional quantum well or any combination of these structures.

According to at least one embodiment of the optoelectronic semiconductor chip, electromagnetic radiation is generated in the at least one active quantum well when the semiconductor chip is in operation. The wavelength of the electromagnetic radiation preferably lies in the spectral range between 200 nm and 3000 nm, in particular in the spectral range between 360 nm and 540 nm inclusive.

According to at least one embodiment of the optoelectronic semiconductor chip, the at least one active quantum well comprises N successive zones in a direction parallel to the growth direction z of the semiconductor chip. N is here a natural number greater than or equal to 2. In other words, the at least one quantum well comprises at least two mutually adjacent zones grown in succession.

According to at least one embodiment of the optoelectronic semiconductor chip, at least two of the zones have average indium contents c which differ from one another. This means that the indium content is purposefully varied inside the active quantum well.

According to at least one embodiment of the semiconductor chip, the active quantum well fulfils the following condition:

$$40 \leq \int c(z)dz - 2.5N - 1.5 \int dz \leq 80.$$

At least one active quantum well fulfilling the above-stated condition means that the parameters indium content c, number of zones N and extent of the zones and of the active quantum well in a direction parallel to the growth direction z are selected to be such that the integral over the indium content c along the growth direction z within the active quantum well, subtracted by 2.5 times the number N of zones and subtracted by 1.5 times the extent of the active quantum well in a direction parallel to the growth direction z is between 40 and 80 inclusive, preferably between 50 and 70 inclusive.

Indium content here means that a proportion of the non-nitrogen lattice sites is substituted by indium atoms. The indium content c should be indicated dimensionlessly in percent with regard to the above condition. This means that c has a dimensionless numerical value of between 0 and 100 inclusive. The number N of zones is likewise intended to be inserted dimensionlessly into the above condition. z is also dimensionless and corresponds to a coordinate in a direction parallel to the growth direction z in nanometres.

In at least one embodiment of the optoelectronic semiconductor chip, the latter is based on a nitride material system and comprises at least one active quantum well. The at least one active quantum well is designed to generate electromagnetic radiation when in operation. Furthermore, the at least one active quantum well comprises N successive zones in a direction parallel to a growth direction z of the semiconductor chip N, N being a natural number greater than or equal to 2. At least two of the zones of the active quantum well have mutually different average indium contents c. Furthermore the at least one active quantum well fulfils the condition $$40 \leq \int c(z)dz - 2.5N - 1.5 \int dz \leq 80,$$

in particular $$50 \leq \int c(z)dz - 2.5N - 1.5 \int dz \leq 70.$$

Such an active quantum well has a stepped and/or ramp-like shape at least in places with regard to the indium content in the growth direction. By this ramp-like and/or stepped structure of the active quantum well, an overlap of the wave functions in the valence band and in the conduction band may be increased. The increased overlap of the wave functions may lead to greater efficiency of the semiconductor chip.

In addition, the charge carrier trapping rate may be increased. In other words, a charge carrier, for example an electron, may with high probability be trapped in the active quantum well and serve in radiation-emitting recombination. The formation of heteroboundaries by one or more steps in the region of a band edge may result in the generation of localised boundary surface charges. These localised boundary surface charges may additionally result in the reduction of piezo fields, whereby the efficiency of radiation generation by the semiconductor chip may likewise be increased.

The above condition relating to the parameters of the quantum well, in particular with regard to the thicknesses of the zones and to their indium content, indicates a parameter range for the configuration of the active quantum well, by means of which surprisingly high efficiency and thus a particularly high overall level of efficiency may be achieved for radiation generation.

The range of values which the term $\int c(z)dz - 2.5N - 1.5 \int dz$ may assume is here not subject to any fundamental limits. For example, the term for conventional active quantum wells may exceed 200 or also be less than 0.

According to at least one embodiment of the optoelectronic semiconductor chip, the at least one active quantum well fulfils the following condition:

$$40 \le \sum_{i=1}^{N} c_i w_i - 2,5N - 1,5 \sum_{i=1}^{N} w_i \le 80,$$

preferably $$50 \le \sum_{i=1}^{N} c_i w_i - 2,5N - 1,5 \sum_{i=1}^{N} w_i \le 70.$$

$c_i$ is here the average indium content of the i-th zone and $w_i$ is a width of the i-th zone of the at least one active quantum well. The zones of the quantum well are here numbered consecutively in a direction parallel to the growth direction z of the semiconductor chip. The numbering of the zones may thus run with the growth direction or contrary to the growth direction.

For example, one zone of the active quantum well is such a region in which the indium content deviates locally by at most 30%, preferably by at most 15%, along the growth direction z from an indium content averaged over the entire zone. In other words pronounced, step-like increases or falls in indium content form, for example, boundaries or boundary regions between adjacent zones.

According to at least one embodiment of the optoelectronic semiconductor chip, the indium content c within the zones of the at least one active quantum well is in each case constant, taking account of manufacturing tolerances. Constant may for example mean that the indium content c within the zones shows deviations from a mean of at most 2 percentage points, in particular of at most 1 percentage point. The term constant does not for example rule out the possibility of step edges in the indium content profile being rounded in shape in a direction parallel to the growth direction. In other words the profile of indium content may be approximated by a step function.

According to at least one embodiment of the optoelectronic semiconductor chip the at least one active quantum well comprises at least three zones. In other words N is greater than or equal to 3. In particular at least three zones, preferably all the zones, in each case have a different average indium content.

According to at least one embodiment of the optoelectronic semiconductor chip, the latter comprises a p-connection side and an n-connection side. On the p-connection side of the semiconductor chip there is located for example p-doped semiconductor material and on the n-connection side n-doped semiconductor material. The semiconductor chip is preferably electrically contactable via the connection sides.

According to at least one embodiment of the optoelectronic semiconductor chip the following applies for the average indium content c of at least some of the zones:
$c_i < c_{i+1}$ and $c_{i+1} > c_{i+2}$.

The zones are here numbered consecutively parallel to the growth direction in particular from the p-connection side towards the n-connection side. Preferably i=1. In other words the active quantum well has a central zone with a high indium content, which is surrounded on both sides by zones with a reduced indium content.

According to at least one embodiment of the optoelectronic semiconductor chip the following also applies: $c_i < c_{i+2}$. In other words, the active quantum well comprises a central zone with a high indium content. A zone which is located closer to the p-connection side than the central zone has a lower indium content than the zone located closer to the n-connection side.

According to at least one embodiment of the optoelectronic semiconductor chip, the following applies, in a direction from the p-connection side towards the n-connection side, for the average indium content for at least some of the zones:
$c_i > c_{i+1}$ and $c_{i+2} > c_{i+1}$ and $c_i > c_{i+2}$.

In other words, the zone i+1 is surrounded by two zones with a higher indium content. Zone i+1 for example constitutes an intermediate barrier in the quantum well profile. i=1 or i=2 is preferred.

According to at least one embodiment of the optoelectronic semiconductor chip, the indium content c increases monotonically in a direction parallel to the growth direction z. In other words, the active quantum well comprises a zone, in particular with i=1, with a maximum indium content, and starting from this zone the indium content increases monotonically in a direction parallel to the growth direction z within the bounds of manufacturing tolerances. This means that for example for each zone i, where 1 is less than or equal to i is less than or equal to N−1, the following applies: $c_i > c_{i+1}$, preferably $c_i > c_{i+1}$. In particular, such a semiconductor chip does not have any intermediate barriers.

According to at least one embodiment of the optoelectronic semiconductor chip, the at least one active quantum well comprises between three and ten zones inclusive. In other words: $3 \le N \le 10$, preferably $3 \le N \le 6$.

According to at least one embodiment of the optoelectronic semiconductor chip, the total width of the active quantum well amounts to between 0.25 nm and 12 nm inclusive, in particular between 0.5 nm and 10 nm inclusive, preferably between 3.5 nm and 8 nm inclusive.

According to at least one embodiment of the optoelectronic semiconductor chip, the following applies for the widths w for some or all of the zones of the at least one active quantum well:
$w_i > w_{i+1}$ and $w_{i+2} > w_{i+1}$.

In other words, a zone with a smaller width is located between two zones of greater width. In particular, the zone $w_i$ is here that zone with the maximum average indium content of the active quantum well. Preferably, therefore, i=1 or i=2.

According to at least one embodiment of the optoelectronic semiconductor chip, the following applies with regard to the widths w for at least some of the zones of the active quantum well:
$w_i < w_{i+1}$ and $w_i < w_{i+2}$.

Zone i+1 is here preferably the zone with the highest indium content. It is thus preferable for i=1. The following may additionally apply in particular: $w_{i+1} > w_{i+2}$.

According to at least one embodiment of the optoelectronic semiconductor chip, the width in a direction parallel to the growth direction z of the at least one intermediate barrier of the active quantum well is less than the minimum width of the further zones of the at least one active quantum well. In other words, the intermediate barrier is thin. In particular, the intermediate barrier has a thickness in the growth direction of between 0.25 nm and 1.25 nm inclusive.

According to at least one embodiment of the optoelectronic semiconductor chip, the thicknesses of the zones, with the exception of the thicknesses of intermediate barriers which may optionally be present, are between 1.5 nm and 4 nm inclusive, in particular between 1.75 nm and 3 nm inclusive.

According to at least one embodiment of the optoelectronic semiconductor chip, the indium content of the zone with the highest indium content is between 15% and 50% inclusive.

According to at least one embodiment of the optoelectronic semiconductor chip, the indium content of at least one zone, which is adjacent the zone with the maximum indium content, is between 30% and 80% inclusive, in particular between 40% and 60% inclusive of the average indium content of the zone with the maximum indium content.

According to at least one embodiment of the optoelectronic semiconductor chip, the following applies for the average indium content of at least one i-th zone, wherein preferably i=2 or i>2:
$0.35\, c_{i-1} \leq c_i \leq 0.65\, c_{i-1}$,
in particular
$0.40\, c_{i-1} \leq c_i \leq 0.60\, c_{i-1}$.

According to at least one embodiment of the optoelectronic semiconductor chip, the latter comprises between two and five active quantum wells inclusive, in a direction parallel to the growth direction z. In other words, the semiconductor chip comprises a multi-quantum well structure.

According to at least one embodiment of the optoelectronic semiconductor chip, the latter comprises at least one inactive quantum well. An average indium content of the inactive quantum well is here less than the average indium content of the zones of the at least one active quantum well which comprise the maximum average indium content.

Inactive here means in particular that the inactive quantum well is not designed for radiation generation. When the semiconductor chip is in operation, none or only a negligibly small proportion of the emitted radiation is thus generated in the at least one inactive quantum well. Preferably the proportion of radiation generated in the inactive quantum wells amounts to less than 10%, in particular less than 2%.

According to at least one embodiment of the optoelectronic semiconductor chip, the thickness of the inactive quantum well is smaller than the thickness of the active quantum well, in a direction parallel to the growth direction z. Preferably, the thickness of the inactive quantum well amounts to at most 75% of the thickness of the active quantum well.

According to at least one embodiment of the optoelectronic semiconductor chip, the latter comprises at least two inactive quantum wells, which enclose the at least one active quantum well.

According to at least one embodiment of the optoelectronic semiconductor chip, at least one inactive quantum well, in particular between one and five inactive quantum wells inclusive, is/are located between two adjacent active quantum wells. Preferably, at least one inactive quantum well, in particular between one and five inactive quantum wells inclusive, is/are also located between the p-connection side and the active quantum well nearest to the p-connection side. The same preferably also applies to the active quantum well nearest to the n-connection side.

According to at least one embodiment of the optoelectronic semiconductor chip, the latter comprises at least two waveguide layers, the at least one active quantum well, in particular all the active quantum wells, being located between the waveguide layers. In other words, the at least one active quantum well is enclosed by the waveguide layers.

According to at least one embodiment of the optoelectronic semiconductor chip, at least one of the waveguide layers comprises one or more charge carrier barrier layers. The charge carrier barrier layer comprises for example an electron barrier layer, which has been introduced into the waveguide layer on the p-connection side. The charge carrier barrier layer may have an elevated Al content and a small thickness of between 0.25 nm and 20 nm inclusive.

According to at least one embodiment of the optoelectronic semiconductor chip, the latter is designed to generate laser radiation. In other words, the semiconductor chip is a laser chip.

According to at least one embodiment of the optoelectronic semiconductor chip, the latter is designed to generate electromagnetic radiation of between 430 nm and 540 nm inclusive. In other words, the semiconductor chip emits in the blue and/or green range of the spectrum.

Furthermore, an optoelectronic semiconductor chip is indicated in which the aluminium content is varied in at least one active quantum well.

In at least one embodiment of the optoelectronic semiconductor chip, the latter is based on a nitride material system and comprises at least one active quantum well, electromagnetic radiation being generated in the active quantum well during operation. In a direction parallel to a growth direction z of the semiconductor chip, the latter comprises N successive zones, at least two of the zones comprising average aluminium contents k different from one another and N being a natural number greater than or equal to 2. The at least one active quantum well here fulfils the condition:

$$70 \leq \int (35-k(z))dz - 2.5N - 1.5 \int dz \leq 120$$

for radiation with wavelengths greater than 285 nm and in particular less than or equal to 360 nm, or $$50 \leq \int k(z)dz - 2.5N - 1.5 \int dz \leq 100$$

for radiation with wavelengths less than or equal to 285 nm and in particular greater than or equal to 210 nm.

Features of the semiconductor chip in which the average indium content of the zones of the active quantum well is varied are also disclosed for the semiconductor chip described herein with a varied aluminium content and vice versa. Since a band gap decreases with increasing indium content and a band gap increases with increasing aluminium content, relational signs relating to indium content need to be reversed accordingly in the case of variation in average aluminium content of the zones of the active quantum well.

Some applications in which optoelectronic semiconductor chips described herein may be used are for instance the backlighting of displays or display means. Furthermore, semiconductor chips described herein may also be used in lighting devices for projection purposes, in floodlights or spotlights or for general lighting.

An optoelectronic semiconductor chip described here will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

BRIEF DESCRIPTION OF THE DRAWINGS

FIG. 1 shows a schematic sectional representation of an exemplary embodiment of a semiconductor chip described herein (A) and a schematic representation of the band structure thereof (B), FIG. 2 is a schematic representation of a further exemplary embodiment of an optoelectronic semiconductor chip described herein, FIG. 3 is a schematic representation of a semiconductor component, FIGS. 4 to 15 are schematic representations of further exemplary embodiments of optoelectronic semiconductor chips described herein, FIG. 18 is a schematic representation of an exemplary embodiment of an optoelectronic semiconductor chip described herein with zones of different aluminium contents.

DETAILED DESCRIPTION OF THE DRAWINGS

Figure 7:
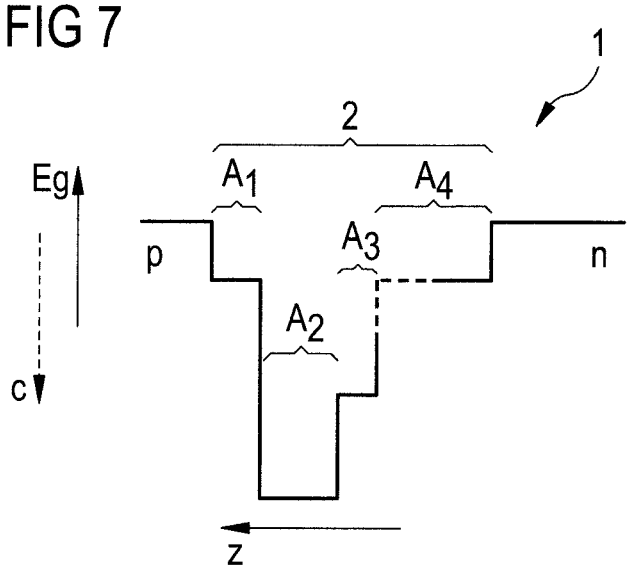

FIG. 1A shows an exemplary embodiment of an optoelectronic semiconductor chip 1, schematically by way of the profile of the indium content c and a band gap $E_g$ in a growth direction z. An active quantum well 2 has a higher indium content c compared with the regions of the semiconductor chip 1 surrounding the quantum well 2. The quantum well 2 comprises two zones $A_{1,2}$. In the first zone $A_1$ of the quantum well 2 the indium content c is greater than in the second zone $A_2$. When the semiconductor chip 1 is in operation, radiation is preferably generated virtually exclusively in the first zone $A_1$.

The semiconductor chip 1 is based for example on the InGaN material system. The band gap $E_g$ may, for an indium content x in percent, be stated approximately as follows, see also the publication Applied Physics Letters, vol. 80, issue 25, year 2002, pages 4741 to 4743:
$E_g(x) = x \cdot 3.42 + (1-x) \cdot 0.77 - x \cdot (1-x) \cdot 1.43$.

The band gap $E_g$ is here stated in eV. The band gap $E_g$ decreases as the indium content increases. For a band gap $E_g$ corresponding to a wavelength of around 450 nm, the indium content preferably amounts to between 17% and 22% inclusive, while for a band gap corresponding to a wavelength of around 490 nm, it amounts to preferably between 24% and 29% inclusive.

The indium content c in zones $A_1$, $A_2$ is in each case approximately constant. For example the indium content $c_1$ of the first zone $A_1$ amounts to 22% and the indium content $c_2$ of the second zone $A_2$ to around 12%. The width $w_1$ of the first zone $A_1$ is around 2.5 nm, while the width $w_2$ of the second zone $A_2$ is around 2 nm. Thus, the total width W of the active quantum well 2 amounts to around 4.5 nm. Zones $A_{1,2}$ are numbered consecutively contrary to the growth direction z of the semiconductor chip 1. The numbering thus runs in the direction from a p-connection side p towards an n-connection side n of the semiconductor chip 1.

Because of the constant indium content c in zones $A_{1,2}$ the term $\int c(z)dz - 2.5N - 1.5 \int dz$ may be expressed by the term $$\sum_{i=1}^{N} c_i w_i - 2,5N - 1,5 \sum_{i=1}^{N} w_i.$$

The indium content $c_i$ of the i-th zone is here indicated dimensionlessly in percent and the widths $w_i$ dimensionlessly in nanometres. N corresponds to the number of zones $A_{1,2}$. For the active quantum well 2 according to FIG. 1A, there is obtained for the term a value of:
$[22 \cdot 2.5 + 12 \cdot 2] - [2.5 \cdot 2] - [1.5 \cdot (2.5+2)] \approx 67$.

It is possible to determine the value of the term for the active quantum well 2 by measuring the quantum well 2 for instance by means of electron microscopy, in particular transmission electron microscopy.

FIG. 1B illustrates schematically the profile of the energies E of the valence band and the conduction band of the semiconductor chip 1 according to FIG. 1A in the growth direction z. The band gap $E_g$ corresponds to the difference between the energies E of the valence band and the conduction band, in each case in the growth direction z. Wave functions of the valence band and of the conduction band are in each case symbolised as thick lines, and the associated energy levels as thin horizontal lines. The region of overlap of the wave functions of the basic states of the valence band and the conduction band is comparatively large. This enables a high recombination rate for charge carriers, i.e. electrons and holes, in the quantum well 2. The rate at which charge carriers are trapped in the active quantum well 2 may also be increased.

FIG. 2 is a schematic representation of a further exemplary embodiment of a semiconductor chip 1. The profile of the indium content c has three zones $A_{1,2,3}$ in the growth direction z. The active quantum well 2 is formed by the three zones. An approximate, average indium content of the zones $A_{1,2,3}$ is illustrated as a broken line. The real profile of the indium content c comprises deviations from this line, in particular in the regions of the edges of the steps of the idealised profile shown as a broken line. However, the individual zones $A_{1,2,3}$ are separated clearly from one another by regions exhibiting a sharp rise or fall in the indium content c.

In the exemplary embodiments described below, an idealised indium content c approximated by steps is illustrated in the growth direction z. It is thus possible for the indium content c to deviate from the profiles shown, in a manner similar to FIG. 2.

FIG. 3A shows a semiconductor component, in which the active quantum well 2 has a width W of around 6 nm and an average indium content c of around 22%. The term $$\sum_{i=1}^{N} c_i w_i - 2,5N - 1,5 \sum_{i=1}^{N} w_i$$

thus has a value of around 120. In this way the basic state wave functions in the valence band and in the conduction band have only a relatively small overlap, cf. FIGS. 3B and 3C. In addition, a gradient of the energies of the valence band and the conduction band in the region of the quantum well 2 is comparatively large due to piezo fields, symbolised by an inclined broken line in FIG. 3C.

It is possible for the sides of the quantum well 2 to exhibit a ramp-like profile and a modified active quantum well 2' to be produced, symbolised by a dash-dotted line.

A further exemplary embodiment of a semiconductor chip 1 is shown in FIG. 4. Zone $A_2$ with the highest indium content $c_2$ of the active quantum well 2 is adjoined by a zone $A_1$ in the direction of the p-connection side p, which zone $A_1$ comprises a smaller average indium content $c_1$. Zone $A_1$ may also be ramp-shaped, indicated by a dash-dotted line.

As is visible in FIG. 4B, compared with FIG. 3C the gradient of the energy E in the growth direction z in the region of zone $A_2$ with the maximum indium content $c_2$ is significantly reduced due to zone $A_1$, as is indicated in FIG. 4B by a solid line. For direct comparison, in FIG. 4B the slope of the energy E of the quantum well 2 according to FIG. 3C is again shown as a broken line. In other words, zone $A_1$ reduces a the gradient of the potential profile. This reduction in gradient leads to increased efficiency with regard to radiation generation in the active quantum well 2.

In the exemplary embodiment according to FIG. 5 of the semiconductor chip 1, the active quantum well 2 comprises three zones $A_{1,2,3}$. Zone $A_2$ with the maximum indium content $c_2$ has the greatest width $w_2$. The indium content $c_1$ of the zone $A_1$ on the p-connection side is lower than the indium content $c_3$ of the n-connection side zone $A_3$ on the re-connection side. The same applies to the widths $w_{1,3}$ of zones $A_{1,3}$.

As is visible from FIG. 5B, the quantum well 2 has a comparatively large effective width and thus a high charge carrier trapping rate. The gradient of the potential profile is likewise reduced. Piezo fields are reduced by local charges at the heteroboundaries between zones $A_{1,3}$ and the surrounding semiconductor material outside the active quantum well 2. In this way, particularly high efficiency in radiation generation may be achieved in the quantum well 2.

In the exemplary embodiment according to FIG. 6, the active quantum well 2 comprises three zones $A_{1,\ 2,\ 3}$. The indium content $c_1$ rises monotonically contrary to the growth direction z, starting from the zone $A_1$. The step edge between zones $A_{2,\ 3}$ may, as indicated by a dotted line, for example also be rounded in shape, unlike that shown in FIG. 6. Unlike that shown in FIG. 6, the active quantum well 2 may also comprise distinctly more than three zones $A_{1,\ 2,\ 3}$.

In the exemplary embodiment according to FIG. 7, the active quantum well 2 comprises both a zone $A_1$ on the p-connection side and a plurality of zones $A_{3,\ 4}$ on the re-connection side, which surround the zone $A_2$ with the maximum average indium content $c_2$.

Figure 8:
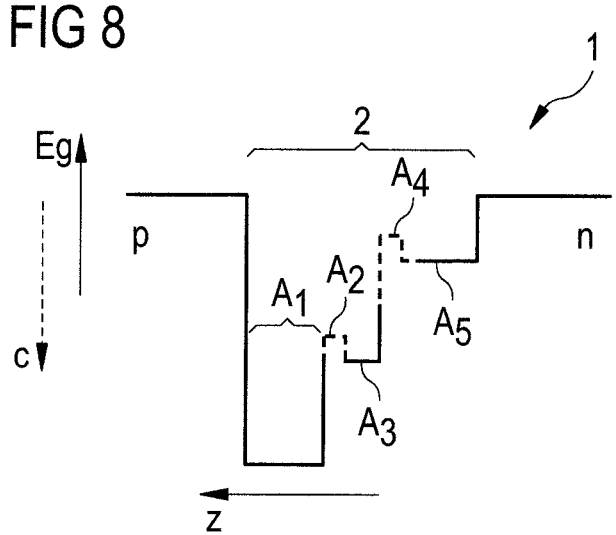
Figure 9:
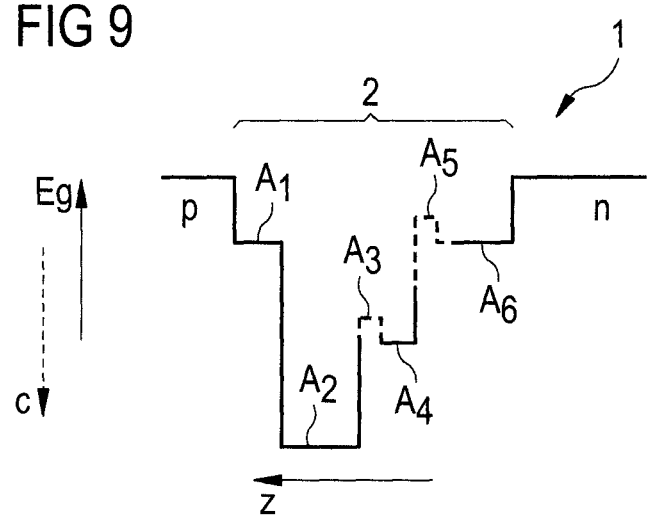

In the exemplary embodiment of the semiconductor chip 1 according to FIG. 8, the active quantum well 2 comprises two intermediate barriers, which are formed by the zones $A_{2,\ 4}$. The indium content $c_{2,\ 4}$ of zones $A_{2,\ 4}$ is lower than in the in each case adjacent zones and/or the aluminium content of zones $A_{2,\ 4}$ is higher. According to FIG. 9, a zone $A_1$ on the p-connection side with a lower indium content $c_1$ is also additionally present.

Figure 10:
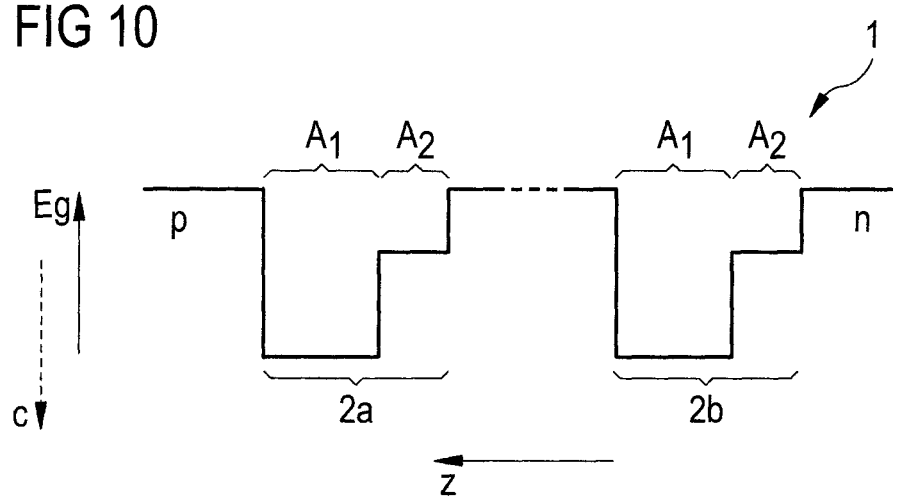

According to FIG. 10, the semiconductor chip 1 comprises two active quantum wells 2a, b. Each of the quantum wells 2a, b comprises two zones $A_{1,\ 2}$. Unlike in FIG. 10 and as indicated by the dotted line between the active quantum wells 2a, b, the semiconductor chip 1 may also for example comprise three, four, five or more active quantum wells.

Figure 11:
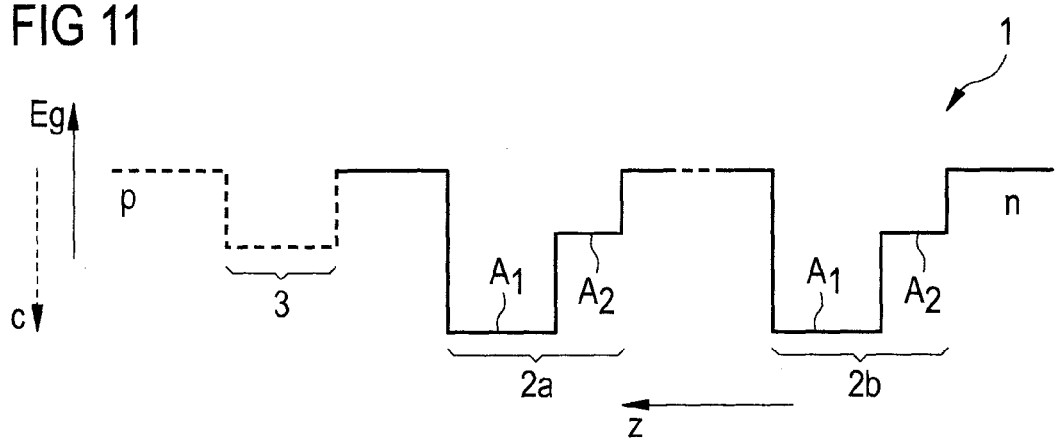

According to FIG. 11, the semiconductor chip 1 also comprises an inactive quantum well 3 in addition to the active quantum wells 2a, 2b. The indium content of the inactive quantum well 3 lies for example between that of zones $A_{1,\ 2}$ of the active quantum wells $2_{a,\ b}$. The inactive quantum well 3 is located on the p-connection side p of the semiconductor chip 1. Unlike what is shown in FIG. 11, it is also possible for the inactive quantum well 3 also to comprise a plurality of zones with different indium contents and/or aluminium contents.

Figure 12:
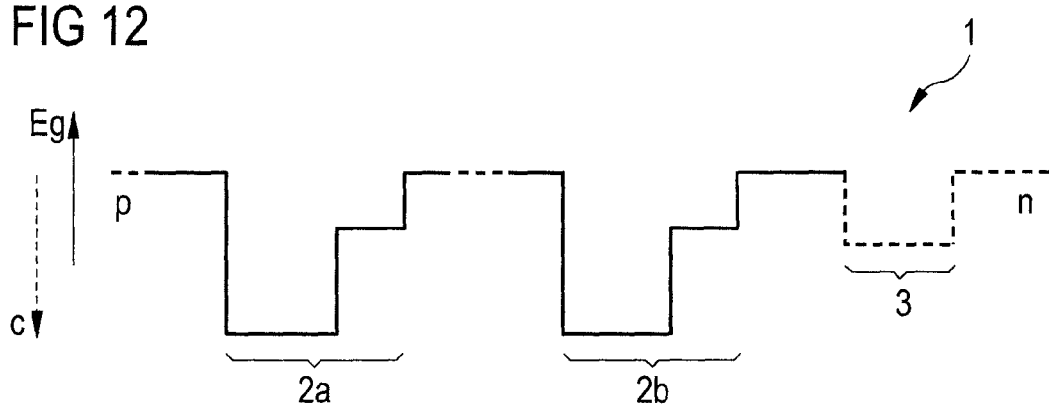
Figure 13:
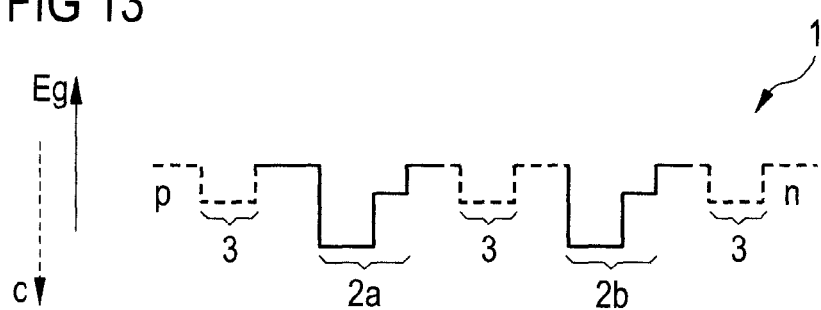

FIG. 12 shows that the inactive quantum well 3 may also be located on the n-connection side n. It is also possible for groups with up to five inactive quantum wells 3 to be formed on the n-connection side n and/or on the p-connection side p. It is not in this case necessary for the various groups of inactive quantum wells 3 in each case to have the same number of inactive quantum wells 3. The same is true, see FIG. 13, of an inactive quantum well 3 or a group with a plurality of inactive quantum wells 3 located between the active quantum wells 2a, b.

Figure 14:
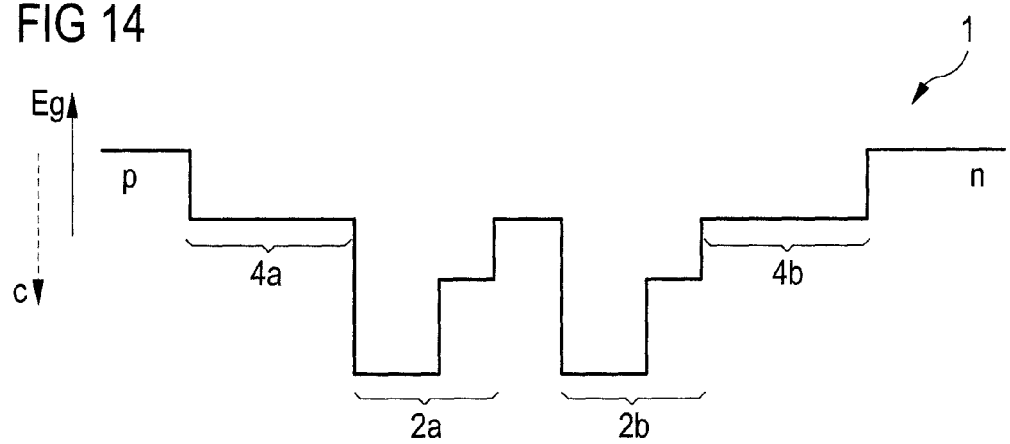

According to FIG. 14, the optoelectronic semiconductor chip 1 additionally comprises two cladding layers 4a, b, which enclose or border the active quantum wells 2a, b.

Figure 15:
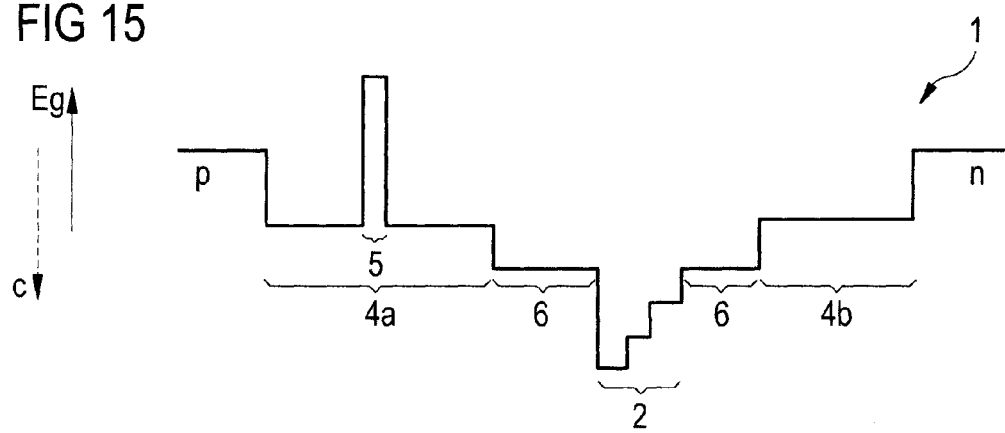

In the exemplary embodiment according to FIG. 15, the semiconductor chip 1 additionally in each case comprises a barrier layer 6 between the active quantum well 2 and the waveguide layers 4a, b. In addition, the waveguide layer 4a on the p-connection side comprises a charge carrier barrier layer 5. The charge carrier barrier layer 5 is formed for example of a thin layer with an elevated aluminium content.

Unlike that shown in FIG. 15, the semiconductor chip 1 also comprises a plurality of active quantum wells 2 and optionally likewise one or more inactive quantum wells 3.

In the exemplary embodiments of the semiconductor chip 1 according to FIGS. 1, 2 and 4 to 15, the at least one active quantum well 2 is configured with regard to the number N of zones A, indium content c and the width w of the zones A in each case such that the term $$\int c(z)dz - 2,5N - 1,5\int dz$$

or $$\sum_{i=1}^{N} c_i w_i - 2,5N - 1,5\sum_{i=1}^{N} w_i$$

has a value of between 40 and 80 inclusive, in particular between 50 and 70 inclusive.

Figure 16:
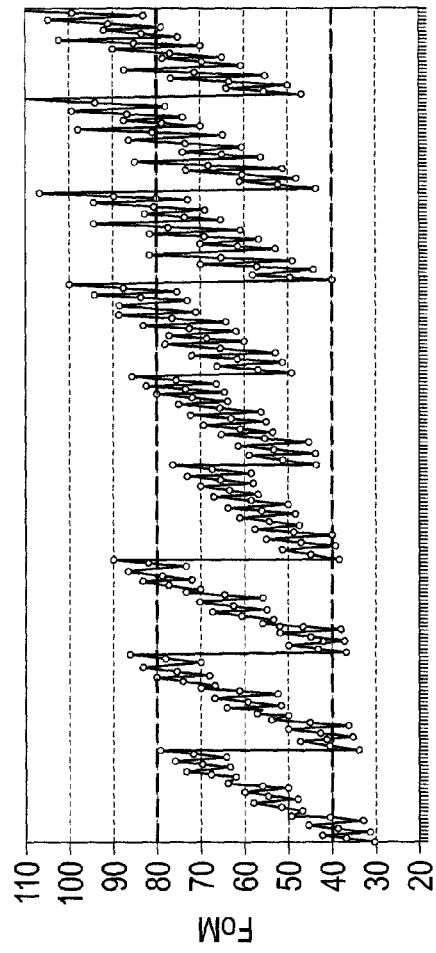
FIGS. 16 and 17 are schematic representations of parameter variations for semiconductor chips.
Figure 17:
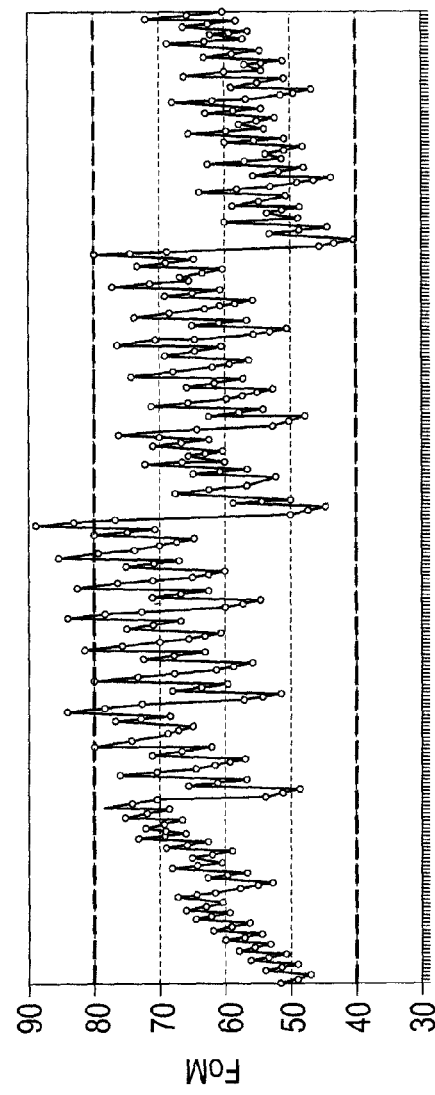

FIGS. 16 and 17 schematically show parameter variations relating to the indium content c and the widths w of the zones A of the active quantum well 2 of semiconductor chips. For the respective variations of the parameter, the value of the term $$\int c(z)dz - 2.5N - 1.5\int dz,$$

FoM for short, was plotted along the x-axis. According to FIG. 16, the active quantum well in each case comprises two zones A. Between FoM values of 40 and 80, in particular between 50 and 70, the semiconductor chips display high efficiency, which is expressed for example in a laser activity. The same applies for the semiconductor chip according to FIG. 17, in which the active quantum well in each case comprises three zones A.

For example, the efficiency of the semiconductor chips is greater in the stated FoM value ranges than outside these value ranges, wherein the efficiency is the quotient of an emitted optical output power and an electrical input power, with which the semiconductor chips are operated. At a wavelength of the emitted radiation of around 440 nm and an optical output power of 30 mW, the efficiency for FoM values outside the stated ranges may be less than 6%, and for FoM values in particular of between 50 and 70 inclusive it may be greater than or equal to 8%. For a wavelength of around 480 nm and an output power of 5 mW it is possible for the efficiency for FoM values outside the stated ranges to be less than 0.5%, and for FoM values in particular of between 50 and 70 inclusive to be at least 0.6%, preferably at least 0.8%.

FIG. 18 shows an exemplary embodiment of a semiconductor chip 1 in which the aluminium content k is differently adjusted in two zones $A_{1,\ 2}$ in the growth direction z of the active quantum well 2. The aluminium content k and thicknesses of the zones $A_{1,\ 2}$ are selected such that the active quantum well 2 fulfils the condition:

$$50 \leq \int (35-k(z))dz - 2.5N - 1.5\int dz \leq 120.$$

The exemplary embodiment according to FIG. 18 may also comprise inactive quantum wells, a plurality of active quantum wells and/or cladding layers and barrier layers, for example similar to the exemplary embodiment according to FIG. 15.

It is also possible for adjustment of the aluminium content k of the zones A of the active quantum well 2 to be combined with adjustment of the indium content c, for instance according to FIGS. 1, 2 and 4 to 15.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip, based on a nitride material system, comprising at least one active quantum well, wherein:

during operation, electromagnetic radiation is generated in the active quantum well, the active quantum well comprises N successive zones in a direction parallel to a growth direction z of the semiconductor chip, N being a natural number greater than or equal to 2, the zones are numbered consecutively in a direction parallel to the growth direction z, at least two of the zones have average aluminium contents k that differ from one another, and the active quantum well fulfils the condition:

$$50 \leq \int (35-k(z))dz - 2.5N - 1.5 \int dz \leq 120.$$

2. The optoelectronic semiconductor chip according to claim 1, wherein the aluminium content k is in each case constant within the zones of the at least one active quantum well.

3. The optoelectronic semiconductor chip according to claim 2, wherein N is greater than or equal to 3, wherein, in a direction parallel to the growth direction z and from a p-connection side towards an n-connection side of the semiconductor chip, the following applies for the average aluminium content for at least some of the zones:

$k_i > k_{i+1}$ and $k_{i+1} < k_{i+2}$, and wherein the zones are numbered consecutively in a direction parallel to the growth direction z.

4. The optoelectronic semiconductor chip according to claim 3, wherein the following applies:

$k_i > k_{i+2}$.

5. The optoelectronic semiconductor chip according to claim 4, wherein N is greater than or equal to 3, wherein, in a direction parallel to the growth direction z and from a p-connection side towards an n-connection side of the semiconductor chip, the following applies for the average aluminium content for at least some of the zones:

$k_i < k_{j+1}$ and $k_{j+2} < k_{j+1}$ and $k_j < k_{j+2}$, wherein the zones are numbered consecutively in a direction parallel to the growth direction z, and wherein $k_j$ is the average aluminium content of the j-th zone and $j \neq i$.

6. The optoelectronic semiconductor chip according to claim 1, wherein the aluminium content k in the at least one active quantum well increases monotonically in a direction parallel to the growth direction z.

7. The optoelectronic semiconductor chip according to claim 1, comprising, in a direction parallel to the growth direction z, a plurality of active quantum wells.

8. The optoelectronic semiconductor chip according to claim 7, comprising a plurality of inactive quantum wells.

9. The optoelectronic semiconductor chip according to claim 1, comprising at least two waveguide layers, wherein the at least one active quantum well is located between the waveguide layers, and wherein at least one of the waveguide layers contains at least one charge carrier barrier layer.

10. The optoelectronic semiconductor chip according to claim 1, which is configured to generate electromagnetic radiation with a wavelength between 285 nm and 360 nm inclusive when the active quantum well fulfils the condition:

$$70 \leq \int (35-k(z))dz - 2.5N - 1.5 \int dz \leq 120.$$

* * * * *